(12) United States Patent
West

(10) Patent No.: US 7,017,091 B2
(45) Date of Patent: Mar. 21, 2006

(54) TEST SYSTEM FORMATTERS CONFIGURABLE FOR MULTIPLE DATA RATES

(75) Inventor: Burnell G. West, Fremont, CA (US)

(73) Assignee: Credence Systems Corporation, Milpitas, CA (US)

( * ) Notice: Subject to any disclaimer, the term of this patent is extended or adjusted under 35 U.S.C. 154(b) by 431 days.

(21) Appl. No.: 10/101,564

(22) Filed: Mar. 18, 2002

(65) Prior Publication Data

US 2003/0033556 A1 Feb. 13, 2003

Related U.S. Application Data

(60) Provisional application No. 60/277,185, filed on Mar. 19, 2001.

(51) Int. Cl.
G01R 31/28 (2006.01)
G01R 31/02 (2006.01)

(52) U.S. Cl. ..................... 714/724; 324/73.1
(58) Field of Classification Search ................ 714/741, 714/742, 744, 734, 724; 324/73.1
See application file for complete search history.

(56) References Cited

U.S. PATENT DOCUMENTS

| | | | |
|---|---|---|---|
| 4,594,544 A | 6/1986 | Necoechea | 324/73 |
| 5,381,421 A | 1/1995 | Dickol et al. | 714/738 |
| 5,477,139 A * | 12/1995 | West et al. | 324/158.1 |
| 5,673,275 A * | 9/1997 | Garcia et al. | 714/724 |
| 5,919,270 A | 7/1999 | Arkin | 714/736 |
| 6,032,282 A | 2/2000 | Masuda et al. | 714/744 |
| 6,128,754 A * | 10/2000 | Graeve et al. | 714/39 |
| 6,532,561 B1 * | 3/2003 | Turnquist et al. | 714/738 |
| 6,609,077 B1 * | 8/2003 | Brown et al. | 702/117 |

* cited by examiner

Primary Examiner—Albert Decady
Assistant Examiner—Esaw Abraham
(74) Attorney, Agent, or Firm—Fish & Richardson P.C.

(57) ABSTRACT

A test system formatter may include a programmable drive circuit configurable to operate in any of a plurality of drive modes, each mode corresponding to a different combination of drive signals or drive timing markers or both, and a programmable response circuit configurable to operate in any of a plurality of strobe modes, each strobe mode corresponding to a different combination of strobe signals. The formatter may also include multiple drive channels and/or multiple response channels, each channel being formed, e.g., of an event logic interface and a corresponding linear delay element. The drive channels provide signals to the drive circuit to be used to generate drive signals or drive timing markers or both. The response channels receive from one or more pin-electronics comparators response signals used to generate fail outputs. The programmable drive and response circuits are configurable to route signals through multiple channels in parallel.

43 Claims, 13 Drawing Sheets

TEST SYSTEM FORMATTERS CONFIGURABLE FOR MULTIPLE DATA RATES

RELATED APPLICATION

This application claims priority to U.S. Provisional Patent Application No. 60/277,185, filed Mar. 19, 2001.

BACKGROUND

The present application relates to test system formatters for testing integrated circuit devices.

Test systems for testing high-speed integrated-circuit devices, such as microprocessors and microcontrollers, have become increasingly sophisticated due to high-speed requirements. To test high-speed devices, conventional test systems generate multiple high-frequency timing signals in order to format signals for each of the device under test (DUT) pins being tested. Each timing signal appears either as a low-to-high voltage transition (a "rising edge") or a high-to-low voltage transition (a "falling edge"). The circuitry used to generate these timing signals generally may be divided into two portions: A first portion, called the "timing marker generator circuit" or an "edge generator circuit," which determines the exact time for the signal transition (i.e., the "timing marker" or "timing edge"), and a second portion, called the "formatter," which applies the edge type ("rising edge" or "falling edge") to the signal at the time required by the timing marker. A timing marker is a pulse, which includes a rising edge immediately followed by a falling edge. Timing markers often are used in high-speed test systems in place of actual edge signals because signals attenuate (i.e., lose fidelity) at higher frequencies in wires of any length. A single timing marker is used to generate an edge. Timing markers fluctuate at twice the frequency of the edges they mark. However, if timing markers are distributed over four signal paths and brought together after traversing the signal transmission medium, each path fluctuation should be half that of the signal ultimately generated. Therefore, transmitting timing markers to generate edges is beneficial if very high-speed signals are required at the DUT pins.

FIG. 1 shows a conventional test system 114, such as the ITS9000KX system made by Schlumberger Technologies, Inc. A central processing unit (CPU) 108 is connected to a sequence control and pattern generation subsystem (Control/Pattern) 112, which has a system clock and other circuitry for generating timing markers. These timing markers are transmitted to the formatter 110, which typically plays a role in establishing the accuracy and functionality of the test system 114. In conventional test systems, the formatter 110 generally is a dedicated resource per DUT pin 118 and is configured to drive or strobe at a fixed frequency, usually the system frequency. The formatter 110 generally includes two complementary formatter circuits—a drive circuit 140 for generating test signals to be applied to the DUT and a response circuit 160 for receiving the signals outputted by the DUT. The drive circuit 140 and response circuit 160 generally can be implemented in a 0.8 micron Silicon bipolar NPN-only ECL process. However, other CMOS processes could be used to achieve substantially the same or better results.

The drive circuit 140 outputs accurate timing edges, formatted signals or a combination of both. In general, conventional drive circuits operate in a single mode, i.e., any given drive circuit outputs certain signals from a family of typically six signals, which may include two formatted signals, such as DHI and DINH, and four timing markers, such as SetHi, SetLo, SetOn and SetZ. For example, the drive circuit 140 may be configured to output formatted signals DHI and DINH to the pin-electronics circuit (PEC) 120. Alternatively, the drive circuit 140 could have been designed to output the formatted signal DINH and the timing markers SetHi and SetLo, which together define DHI. The PEC 120 uses formatted signals DHI and DINH, or their markers depending on which are provided, to determine whether to drive the DUT pin 118 to a predefined logic state, such as high, low, or tri-state, or to receive an output signal from the DUT pin 118.

The response circuit 160 generates timing markers, such as StbHi, StbLo, StbOff, and StbZ, which are used with event type information to strobe the signals ACH and BCL, provided by the pin-electronics comparator 124, to determine whether the DUT pin 118 passes or fails a test. If the state of signals ACH and BCL are different from that which is indicated by the event type, a "fail" signal is generated and outputted at STFL 162.

FIG. 2 shows a formatter 210 in which the drive circuit 240 is designed to output timing markers SetHi, SetLo, SetOn, and SetZ to external circuitry 250. The timing markers SetHi and SetLo are used by external circuitry 250 to reproduce formatted signal DHI, while timing markers SetOn and SetZ are used by external circuitry 250 to reproduce formatted signal DINH. The operation of this is as follows: SetHi sets the state of signal DHI to 1; SetLo sets the state of signal DHI to 0; SetZ sets the state of signal DINH to 1; and SetOn sets the state of signal DINH to 0.

In general, conventional systems provide a family of timing markers assigned to specific roles in the formatting of signals for each of the DUT pins to be tested. In some test systems, the family of timing markers includes three drive markers and three strobe markers. In other test systems, the family of edges includes six drive markers and four strobe markers, or four drive markers (e.g., SetHi, SetLo, SetOn, and SetZ) and four strobe markers (e.g., StbHi, StbLo, StbEnd, and StbZ). In this latter test system, for example, the drive circuit generates four timing markers with each timing marker having a data rate up to 200 MTPS (mega transitions per second). The four timing markers are used to format a signal with edge rates up to 800 MTPS. The resulting formatted signal is transmitted to a pin-electronics circuit, which then provides the signal to the DUT pin. In the same test system, the response circuit generates four edges, which are used to strobe the waveform provided by the pin-electronics comparator at rates up to 800 MTPS.

When the family of edges provided for a given pin is not fast enough to generate the waveform required for a DUT pin, some test systems use a combination of the timing markers in order to double the rate at which timed edges can be applied. For example, in these test systems, two drive circuits are externally gated to generate edge signals, which are used to create a waveform with edge rates up to 1600 MTPS. Similarly, two response circuits are externally gated to generate edges, which are used to strobe the waveform provided by the pin-electronics comparator at the rates up to 1600 MTPS.

SUMMARY

The present inventor recognized that conventional test system formatters tended to be relatively inflexible and expensive to design, manufacture, use and/or configure for use in different testing environments. Consequently, the present inventor developed a flexible test system architecture in which the drive and/or response circuits are selectively programmable to operate in any of several different modes, depending on the testing environment and parameters of the tests being performed. Moreover, the flexible test system architecture may include multiple channels so that several different and independent sets of test signals may be generated by a common drive circuit and/or responses to different test signals may be handled by a common response circuit.

Implementations of the test system formatter described here may include various combinations of the following features.

In one aspect, a drive circuit for an automatic test equipment formatter includes: an event logic section having one or more event logic interfaces, with each event logic interface capable of decoding signals received from an external event timing generation circuit; a linear delay element section having one or more linear delay elements, with each linear delay element coupled to a corresponding event logic interface and capable of generating timing markers corresponding to signals received from an event logic interface; and drive logic that is programmable to operate in any of a plurality of different modes, each mode providing a different combination of drive signals or timing markers or both. The drive circuit can be programmable to provide the combination of drive signals or timing markers at different frequencies.

Each event logic interface may be paired with a corresponding linear delay element to form a channel to provide signals to the drive logic. In that case, the drive circuit can be configured to route signals defining a drive signal or timing marker through one or more channels in parallel.

The drive circuit also may include a register section that can be configured to receive control setup information from an external source. Moreover, the drive circuit may include a timing measurement unit section, which may include at least two timing measurement unit multiplexers.

The drive circuit's drive logic may include one or more programmable multiplexers and associated logic elements, which can be used to logically combine signals received from one or more linear delay elements to form a desired combination of drive signals or timing markers or both. The programmable multiplexers generally are selectively programmable to cause the drive logic to operate in any of a variety of different modes. Each mode may use one or more channels to form corresponding drive signals or timing markers or both. The drive logic also can operate in any of a number of strobe modes. Each strobe mode corresponds to a different combination of strobe signals. For example, each strobe mode may use a different number of channels to form corresponding strobe signals.

In another aspect, a response circuit for an automatic test equipment formatter includes an event logic section, which can have one or more event logic interfaces, with each event logic interface capable of decoding signals received from an external event timing generation circuit, a linear delay element section, which can have one or more linear delay elements, with each linear delay element coupled to a corresponding event logic interface and capable of generating timing markers corresponding to signals received from an event logic interface, and response logic that is programmable to operate in any of a plurality of modes, each mode providing a different combination of strobe signals. The response circuit may be programmable to receive response signals from one or more pin-electronics comparators.

The response circuit may be configured in which each event logic interface is paired with a corresponding linear delay element to form a channel to provide signals to the response logic. In that case, the response circuit can be configured to route response signals received from one or more pin-electronics comparators to one or more channels in parallel.

The response circuit also may include a register section that is configured to receive control setup information from an external source. Moreover, the response circuit may include a timing measurement unit section, which has at least two timing measurement unit multiplexers.

The response circuit's response logic may include one or more programmable multiplexers and associated logic elements, which can be selectively programmable to cause the response logic to operate in any of the different modes. Each mode corresponds to a different number of pin-electronics comparators from which response signals are to be received. Furthermore, each mode uses one or more channels to form corresponding response signals. For example, the response circuit can be configured in a first mode to receive response signals from a single pin-electronics comparator and to use four merged channels to generate fail outputs. As another example, the response circuit can be configured in a second mode to receive response signals from two separate pin-electronics comparators and to use two merged channels for each pin-electronics comparator to generate fail outputs. In yet another example, the response circuit can be configured in a third mode to receive response signals from four pin-electronics comparators and to use a separate channel for each pin comparator to generate fail outputs.

In yet another aspect, a test system formatter may include a programmable drive circuit that is configured to operate in any of one or more drive modes, with each mode corresponding to a different combination of drive signals or drive timing markers or both. The test system formatter also may include a programmable response circuit that is programmable to operate in any of one or more strobe modes, with each strobe mode corresponding to a different combination of strobe signals.

In another aspect, configuring an integrated circuit test system includes providing a test system having a formatter with a programmable drive circuit, configuring the test system to be in communication with a device under test, and programming the drive circuit to operate in a selected mode from among a number of modes, with each mode defining a different combination of formatted drive signals or drive signal timing markers or both. Configuring the integrated circuit test system also may include programming the drive circuit to receive input signals from a number of channels in parallel. The input signals from the number of channels can be merged to generate one or more drive signals, which can increase a drive signal's data rate.

Configuring the integrated circuit test system also may include providing a programmable response circuit; and programming the response circuit to operate in a selected mode from one or more modes. Each mode corresponds to a different number of pin-electronics comparators from which response signals are to be received.

The systems and techniques described here may provide several advantages. For example, because the overall cost of a test system may depend to a significant degree on a relatively small number of custom components (such as the formatter's drive circuit and response circuit), conventional test systems requiring multiple drive circuits and response circuits tended to have relatively expensive manufacturing and configuration costs. In contrast, because the flexible test formatter described here may be selectively programmed using software to operate in any of several different modes, the resulting test formatter finds much broader applicability and may be easily re-configured to adapt to changing test requirements or to adapt to different testing environments. As a result, the design, development and other associated overhead costs may be reduced dramatically.

Moreover, the flexible test formatter described here can be selectively programmed to produce a combination of timing markers and formatted levels at different frequencies. In one configuration, for example, the formatter can be programmed to operate in any of 11 different modes, thereby representing a dramatic increase in flexibility compared to conventional formatters, which typically were hardwired to operate only in a single mode. Further, the programmable formatter can be used not only to provide drive signals in any several different modes, but also can be software configured to generate unformatted markers for strobing applications. The particular modes, frequencies, and/or combinations of timing markers/formatted levels may depend on the objectives of the system designer and/or the requirements of the tests to be performed.

Details of one or more embodiments are set forth in the accompanying drawings and the description below. Other features and advantages will be apparent from the description and drawings, and from the claims.

DRAWING DESCRIPTIONS

Like reference symbols in the various drawings indicate like elements.

DETAILED DESCRIPTION

In the ensuing description, all referenced signals are differential unless otherwise noted.

Figure 1:
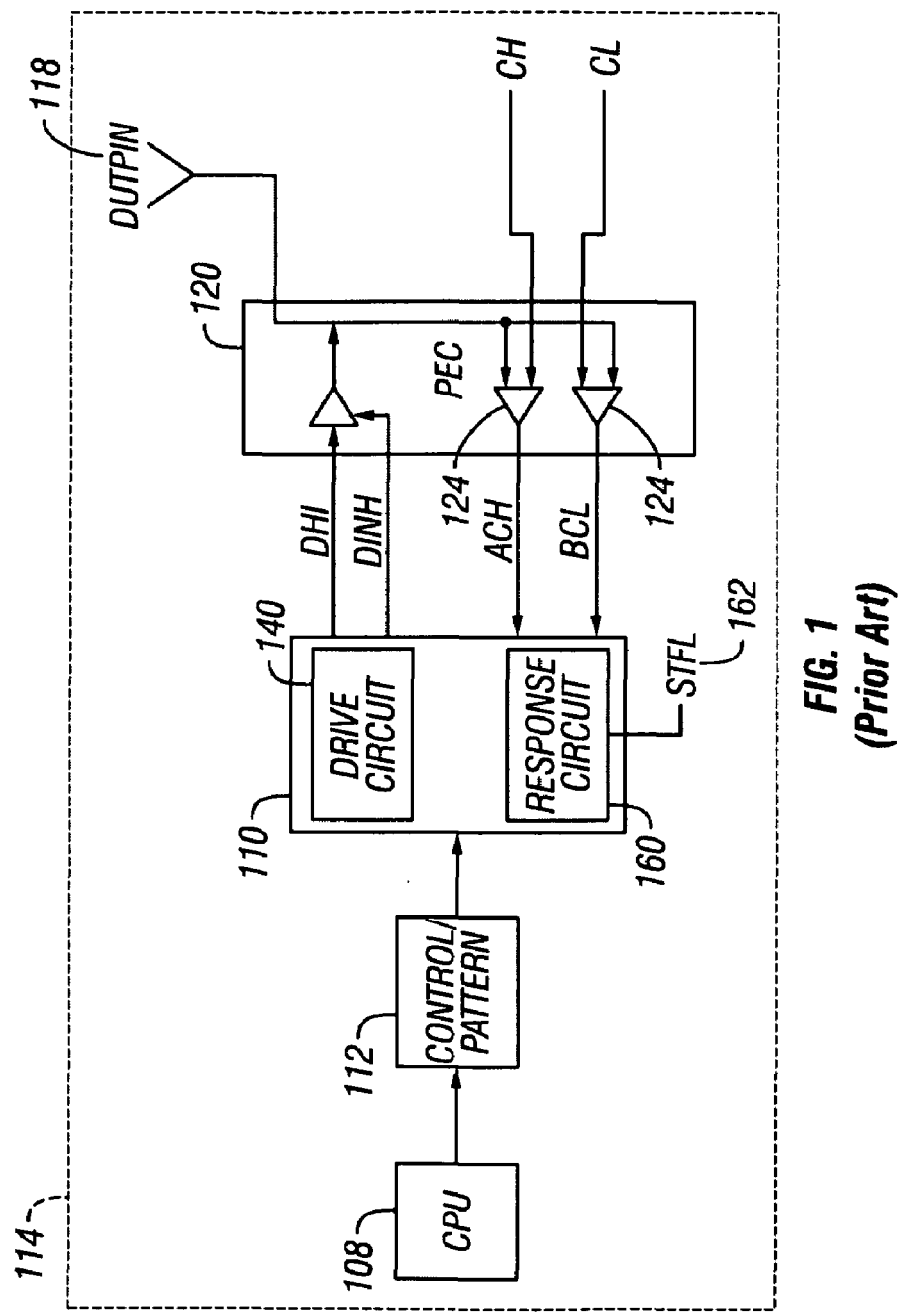
FIG. 1 is a block diagram of a conventional test system.
Figure 2:
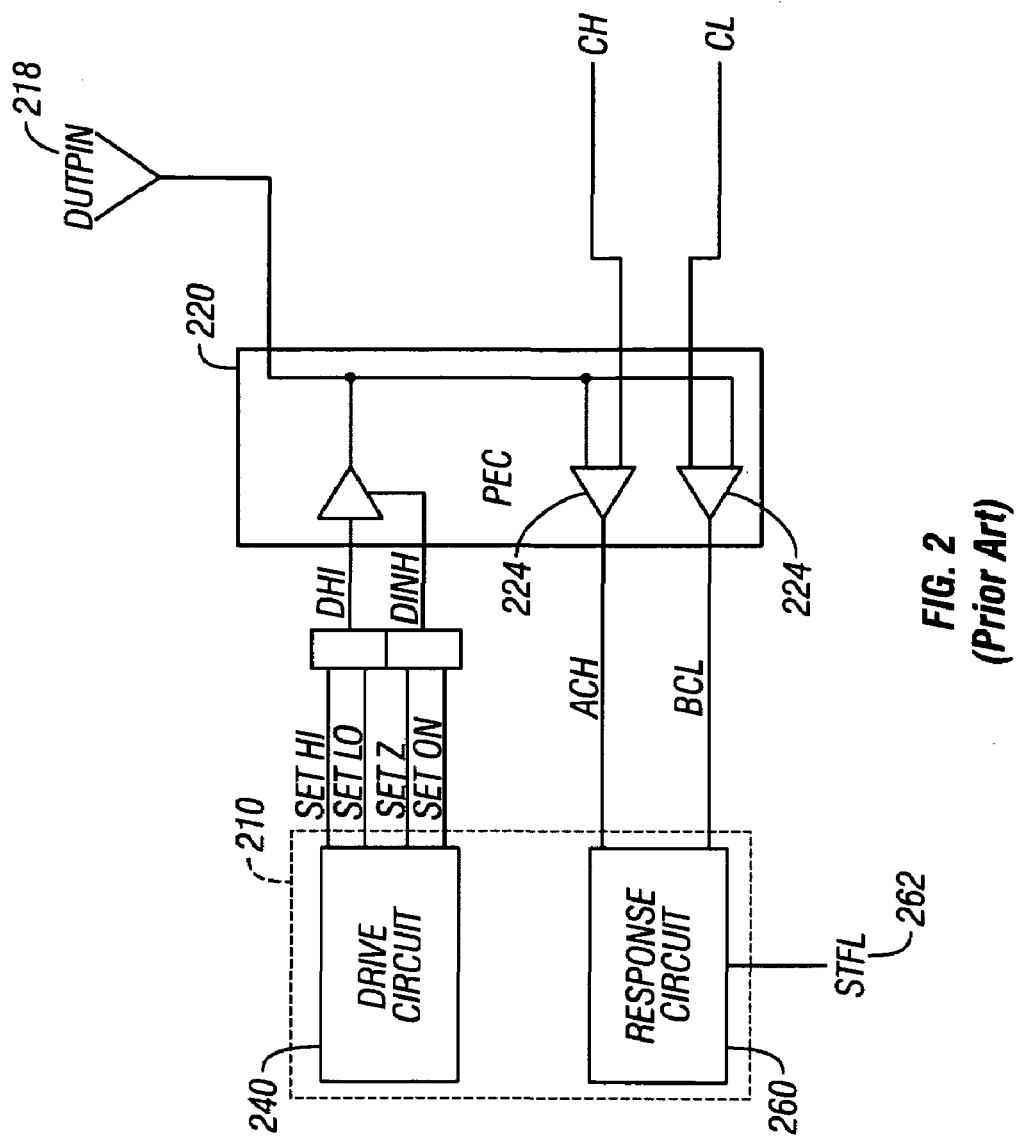
FIG. 2 is block diagram of a conventional test formatter circuit.
Figure 3A:
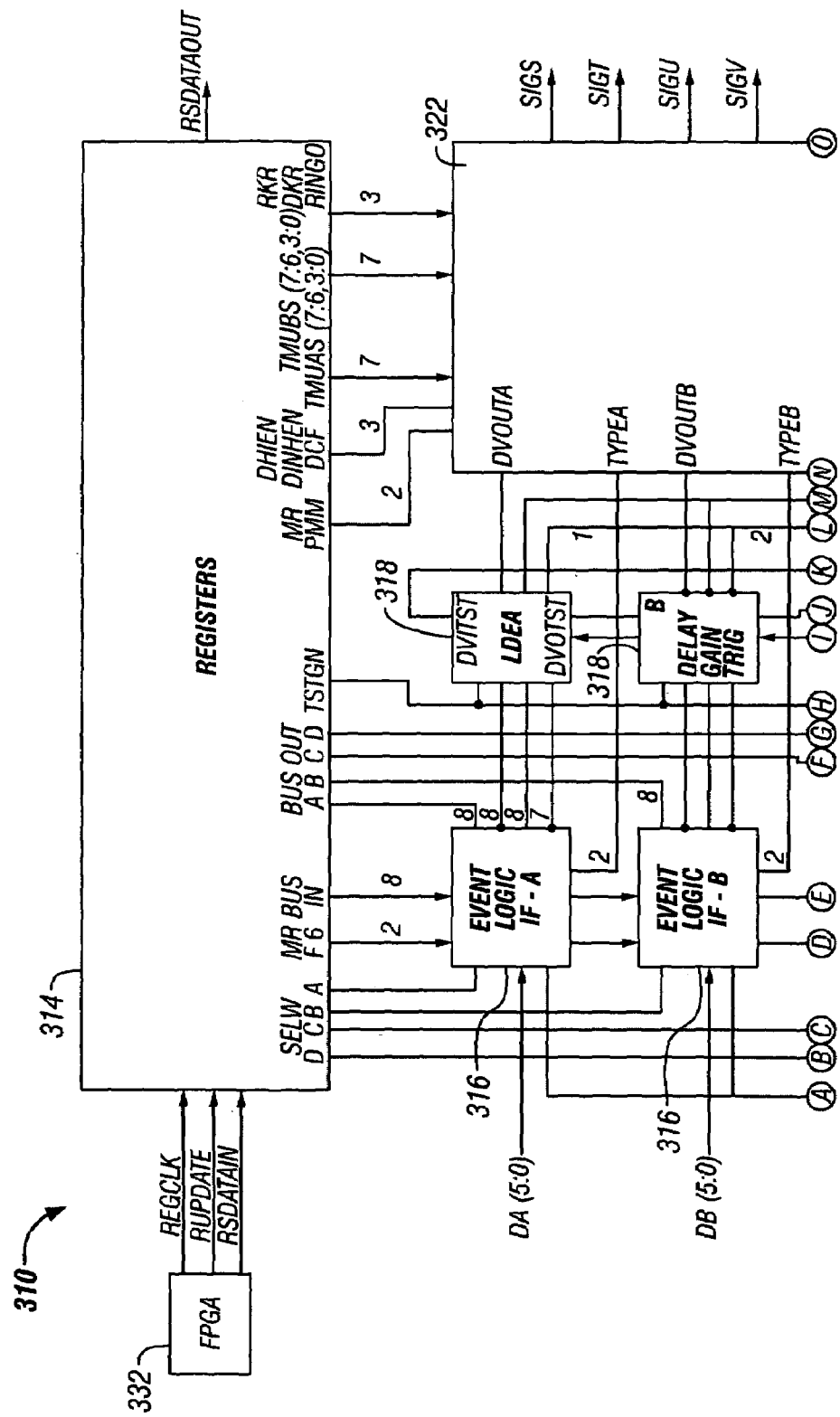
FIG. 3 is a diagram of a selectively programmable drive circuit.
Figure 3B:
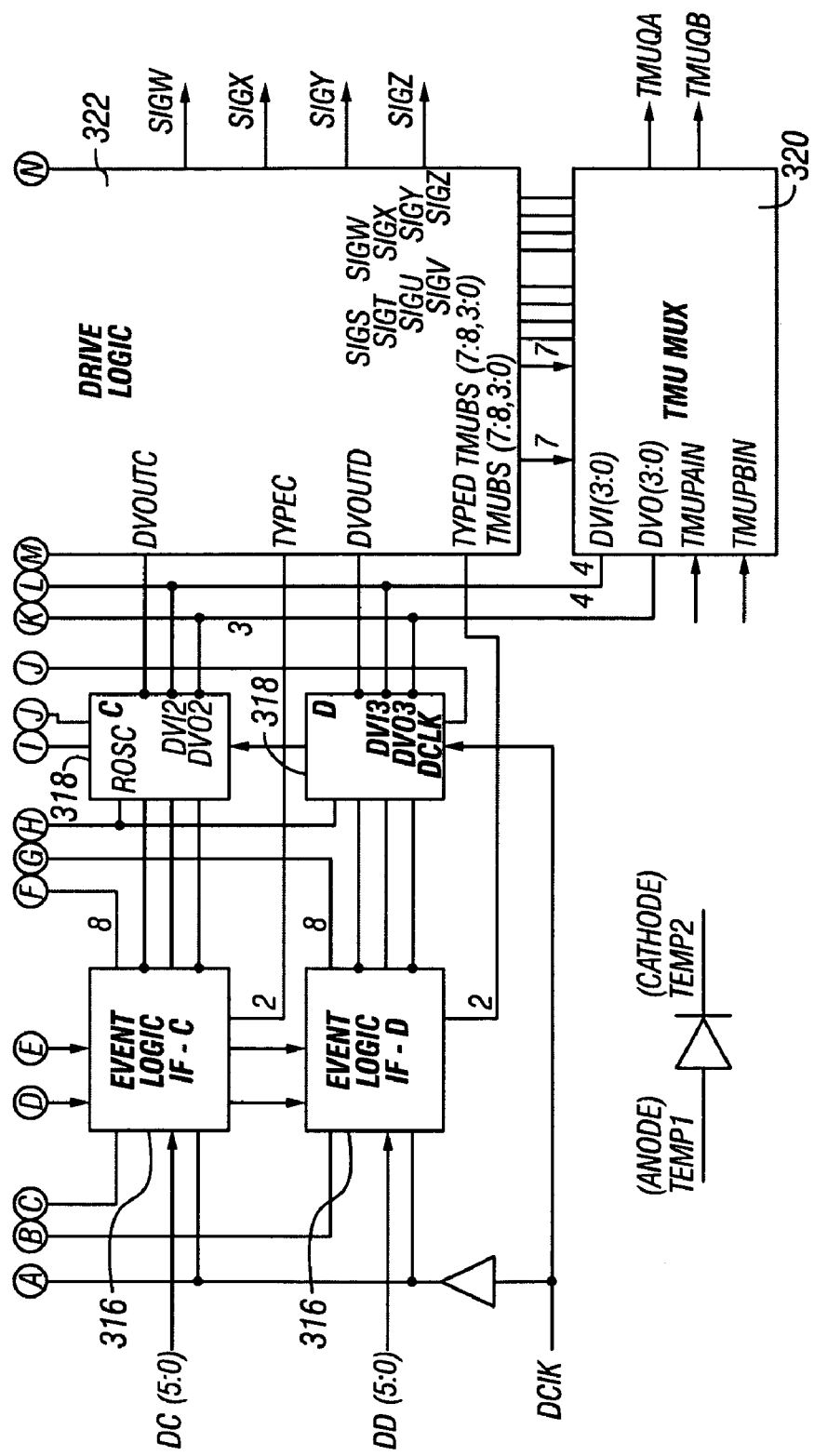

FIG. 3 shows a drive formatter integrated circuit ("drive circuit") 310 that is selectively programmable to operate in different modes. For example, the drive circuit 310 can be programmed to operate in modes in which different combinations of formatted signals and/or corresponding timing markers at different frequencies can be provided to support up to four DUT pin-electronics channels. Drive circuit 310 includes a register section 314, four event logic interface circuits (ELIF) 316, four corresponding linear delay elements (LDE) 318, a time measurement unit multiplexer section (TMUMUX) 320 and a drive logic 322 block.

Each ELIF 316 is paired with an associated LDE 318 to form a channel, or "barrel" through which data and timing signals are passed to the drive logic 322, which forms the desired drive signals and/or timing markers for driving DUT pins. Multiple barrels may be used to provide data signals in parallel to the drive logic 322 for generating a drive signal. As a result, the drive logic 322 can generate higher frequency drive signals and/or timing markers than if only a single barrel was used. Alternatively, or in addition, if higher frequency signals are not required, the multiple barrels can be used to drive more DUT pins than previously possible using conventional drive circuits.

The register section 314 receives control setup information from an external field programmable gate array (FPGA) 332 through a 4-bit serial port, which includes signals REGCLK, RSDATAIN, RUPDATE and RSDATAOUT. The signal RSDATAIN receives from the external FPGA 332 an 18-bit word, which consists of 4 bits of pin participate address, 4 bits of register address, 8 bits of data and 2 bits of address update and read/write enable. Any programming language that facilitates creating this 18-bit word could be used to generate the control setup information. Details of programming the external FPGA 332, in which the participate memory resides, to transmit the 18-bit word are described in U.S. Pat. No. 4,594,544, entitled "Participate Register For Parallel Loading Pin-Oriented Registers in Test Equipment," which is incorporated by reference. Data is transferred into the register section's 314 RSDATAIN or out of the register section's 314 RSDATAOUT at the rising edge of REGCLK, which has a frequency of 100 MHz. RUPDATE marks the end of serial 18-bit word transmitted on RSDATAIN, thereby allowing a WRITE action to take place in the drive circuit 310 or a READ action to serialize a formatter register in the register section 314 for transmission on RSDATAOUT.

Each ELIF 316 receives two 6-bit half-words over successive drive clock (DCLK) cycles, at a run-time operation of 400 MHz, from an external event timing generation integrated circuit. The four parallel 6-bit run-time data access ports are labeled as DA, DB, DC and DD. Essentially, each ELIF 316 decodes the two 6-bit half-words transmitted through its corresponding data access port. The data that is decoded includes a timing delay field (4 bits), an event type field (1 bit), and a flag field (1 bit).

If the flag is TRUE, the other fields are decoded to specify an event, such as format levels (e.g., DHI and DINH), or timing markers (e.g., SetHi, SetLo, SetOn, SetZ, StbHi, StbLo or StbZ), or a combination of both, that are required to be produced at the outputs of drive logic 322. If the flag is FALSE, the data received is registered by each ELIF 316 and held waiting the next cycle. When the flag is successively FALSE followed by TRUE, then the data received in the half-word preceeding the half-word in which the flag is TRUE are combined with the data received in the half-word in which the flag is TRUE to form the full event word (e.g., eight bits of timing delay and two bits of event type). If two successive half-words contain a TRUE flag, then the second successive half-word containing the TRUE flag is combined with the next half-word to form the next full event word.

From that moment on, all successive full event words are formed from the half-word containing the TRUE flag and the next half-word (rather than the previous) until at least two half-words with FALSE flags are received. Three successive half-words with the flag TRUE are not allowed. Two successive half-words with the flag TRUE also are not allowed if anytime previously there had been two successive half-words with TRUE flags and subsequently there have not been two successive half-words with FALSE flags.

Table 1 shows the event types that may be decoded. In Table 1, an 'x' means no change, an "^" means timing marker generated, and an "–" means not applicable. Furthermore, the category of timing markers (i.e., drive or strobe) is established by the state of the STBMODE bit inside the register section 314.

certain of its eight outputs (SIGS, SIGT, SIGU, SIGV, SIGW, SIGX, SIGY and SIGZ).

The drive logic 322 can provide a combination of timing markers and formatted levels at different frequencies to up to four DUT pin-electronics channels (channels W, X, Y and Z) from its eight output signals. As a result, several advantages arise. For example, only one test system using drive circuit 310 with drive logic 322 is needed to test integrated circuit devices requiring different drive signals at different data rates, whereas multiple test systems using a conventional drive circuit would be needed for the same capability because conventional drive circuits can operate only in one mode, i.e., generate and transmit specific drive signals at a specific data rate to a DUT pin. Thus, the cost and time

TABLE 1

Drive Circuit Decoding Event Types

| | | STBMODE = 0 | | | | | | STBMODE = 1 | | | |
|---|---|---|---|---|---|---|---|---|---|---|---|
| Type1 | Type0 | DINH | DHI | SETHI | SETLO | SETON | SETZ | STBHI | STBLO | STBZ | X |
| 0 | 0 | 1 | x | — | — | — | ^ | — | — | — | ^ |
| 0 | 1 | 0 | x | — | — | ^ | — | — | — | ^ | — |
| 1 | 0 | 0 | 0 | — | ^ | ^ | — | — | ^ | — | — |
| 1 | 1 | 0 | 1 | ^ | — | ^ | — | ^ | — | — | — |

In currently available test systems, there are generally two strobe types available which can be selected by register means—an edge strobe and a window strobe. An edge strobe logs an error at the time of the strobe itself. A window strobe is opened at the time of the strobe event, and closed at the time of the "X" event. Therefore, strobe marker "X" denotes the end of a window strobe. If the programmed strobe mode is edge strobe, then the X event has no effect.

Each LDE 318 generates timing markers in response to the timing delay and event type information relayed to it by its corresponding ELIF 316. The operation of the LDE 318 is discussed in further detail below. The drive logic 322, an required to test integrated-circuit devices needing different drive signals at different data rates are dramatically reduced.

As indicated above, the drive logic 322 may be programmed to operate in any of several different output modes. The drive logic 322 can be used to provide not only drive signals (e.g. output modes D1L, D1PL, D1P D2L, D2PL, D2P, D4L and D4P in Table 2) but also software configured unformatted markers for strobing applications (e.g., output modes R1P, R2P and R4P in Table 2). All output mode settings are communicated to the drive logic 322 from the register section 314.

TABLE 2

Drive Logic Operation Modes

| | DRIVE | | | | | | | | STROBE | | |
|---|---|---|---|---|---|---|---|---|---|---|---|
| Output | Mode D1L | Mode D1PL | Mode D1P | Mode D2L | Mode D2PL | Mode D2P | Mode D4L | Mode D4P | Mode R1P | Mode R2P | Mode R4P |
| SIGS | DHIW | SetHiW | SetHiW | DHIW | SetHiW | SetHiW | DHIW | SetHiW | StbHiW | StbHiW | StbHiW |
| SIGT | unused | SetLoW | SetLoW | unused | SetLoW | SetLoW | DHIX | SetLoW | StbLoW | StbLoW | StbLoW |
| SIGU | DINHW | DINHW | SetOnW | DINHW | DINHW | SetOnW | DINHW | SetHiX | StbZW | StbZW | StbHiX |
| SIGV | unused | unused | SetZW | unused | Unused | SetZW | DINHX | SetLoX | StbEndW | StbEndW | StbLoX |
| SIGW | unused | unused | Unused | DHIY | SetHiY | SetHiY | DHIY | SetHiY | unused | StbHiY | StbHiY |
| SIGX | unused | unused | Unused | unused | SetLoY | SetLoY | DHIZ | SetLoY | unused | StbLoY | StbLoY |
| SIGY | unused | unused | Unused | DINHY | DINHY | SetOnY | DINHY | SetHiZ | unused | StbZY | StbHiZ |
| SIGZ | unused | unused | Unused | unused | Unused | SetZY | DINHZ | SetLoZ | unused | StbEndY | StbLoZ | innovative feature of drive circuit 310, receives the timing markers through DVOUT*, where * is A, B, C and D, and event type information from the ELIF 316 through TYPE*, where * is A, B, C and D. Based on the event type and timing markers the drive logic 322 receives, it provides timing markers, formatted signals or a combination of both to The output modes shown in Table 2 are as follows:
Mode D1L—The four ELIF/LDE pairs are merged to generate formatted signals DHIW and DINHW for DUT pin-electronics driver W. In this mode, direct connection to a high-performance pin-electronics driver is required to minimize timing errors. Six outputs are unused. The maximum data rate is 800 MTPS.

Mode D2L—The ELIF/LDE pairs A and B are merged to generate format signals DHIW and DINHW for DUT pin-electronics driver W, and the ELIF/LDE pairs C and D are merged to generate formatted signals DHIY and DINHY for DUT pin-electronics driver Y. Four outputs are unused. In this mode, the minimum pulse width is less than 1 ns and the maximum data rate is 400 MTPS.

Mode D4L—Each ELIF/LDE pair generates formatted signals DHI and DINH to four DUT pin-electronics drivers W, X, Y, and Z. In this mode, the minimum pulse width is 4 ns and the data rate is 200 MTPS. No outputs are unused.

Modes D1P and R1P—The four ELIF/LDE pairs are merged and generate timing markers SetHiW, SetLoW, SetOnW, and SetZW (or StbHiW, StbLoW, StbEndW, and StbZW) for DUT pin-electronics driver W. These timing markers also can be fanned out for multisite testing or they can be combined with a similar set of outputs from a separate device for higher data rates. Four outputs are unused.

Modes D2P and R2P—The ELIF/LDE pairs A and B are merged to generate timing markers SetHiW, SetLoW, SetOnW, and Set ZW (or StBHiW, StbLoW, StbEndW, and StbZW) for DUT pin-electronics driver W, and ELIF/LDE pairs C and D are merged to generated timing markers SetHiY, SetLoY, SetOnY, and Set ZY (or StBHiY, StbLoY, StbEndY, and StbZY) for pin-electronics driver Y. These timing markers also can be fanned out for multisite testing with half the data rate of Modes D1P and R1P at half the cost. No outputs are unused.

Modes D4P and R4P—Each ELIF/LDE pair generates timing markers (SetHi and Setlo or StbHi and StbLo) for each of the DUT pin-electronics channels W, X, Y and Z. These timing markers also can be fanned out for multisite testing with half the data rate of Modes D2P and R2P at half the cost. No outputs are unused.

Mode D1PL—The four ELIF/LDE pairs are merged to generate timing markers SetHiW and SetLoW and the formatted signal DINHW for DUT pin-electronics channel W. Five outputs are unused.

Mode D2PL—The ELIF/LDE pairs A and B are merged to generate timing markers SetHiW and SetLoW and the formatted signal DINHW for DUT pin-electronics driver W, and ELIF/LDE pairs C and D are merged to generate timing markers SetHiY and SetLoY and formatted signal DINHY for DUT pin-electronics driver Y. Two outputs are unused.

Modes D1L, D1P and R1P have the highest accuracy requirements because all four ELIF/LDE pairs are merged. Mode D1L is particularly suited for data formatting in serial bit stream test requirements and for high-speed clocking where there is a requirement for pulse stretching or shrinking with maximum flexibility. Modes D1P, R1P, D2P, R2P, D4P and R4P generate timing markers. These modes can be used for either DUT input format timing or for DUT output strobing depending on the state of the STBMODE bit inside the register section 314. Modes D1PL and D2PL generate timing markers and formatted signals that can be used in memory test applications. The pulse-width of timing markers SetHi, SetLo, SetOn, SetZ, StbHi, StbLo, StbEnd and StbZ can be software configured anywhere between 625 ps to 1.25 ns, in approximately 90 ps intervals. The formatted signals DHI and DINH can be forced at the output(s), by setting appropriate bits in a software register in the register section 314 during the calibration of the pin-electronics.

Although Table 2 describes eleven modes of operation, different, fewer or additional modes could be supported depending on the objectives and preferences of the system designer and/or depending on the constraints of the testing environment.

Figure 4:
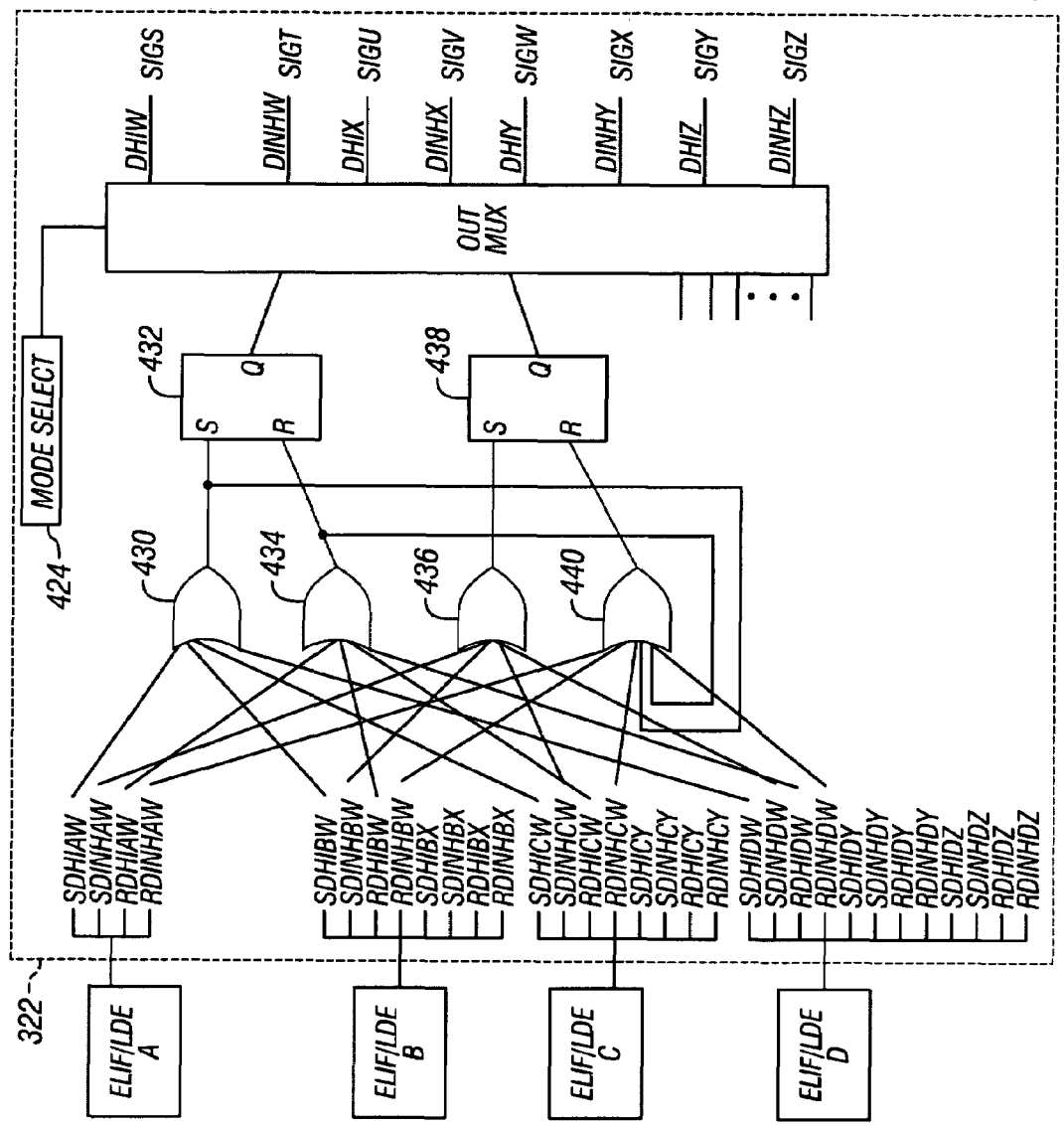
FIG. 4 is a diagram showing a logical representation of the drive logic programmed to operate in a particular mode.

FIG. 4 illustrates an example of the operation of drive logic 322 in the generation of formatted signals DHIW and DINHW in a particular one of the modes—namely, mode D1L. It should be noted that FIG. 4 is a functional depiction, using logic gate representations, of drive logic 322 operating in mode D1L. In practice, the drive logic 322 is implemented by a combination of logic gates and multiplexers, as well as set and reset registers and latches, the interconnections of which are selectable based upon the output mode selected by the user of the test system. Assuming that a user selects mode D1L, mode type information representing mode D1L is relayed to the drive logic 322 from the register section 314 through the Mode Select 424. The drive logic 322 generates internal timing markers sdhiaw, sdhibw, sdhicw and sdhidw based upon the timing markers and event type information the drive logic 322 receives from the ELIF/LDE pairs A, B, C and D. These internal timing markers are relayed to an OR-logic gate 430 and the output of the OR-logic gate 430 sets the set input of a Set/Reset latch 432, as well as is provided as an input to an OR-logic gate 440. The "set" signal, in this instance, implies that the formatted signal DHIW is set to logic high. As a consequence, the formatted signal DHIW (set to logic high) results at the output of the Set/Reset latch 432. Conversely, when the formatted signal DHIW needs to be set to logic low, internal timing markers rdhiaw, rdhibw, rdhicw and rdhidw are relayed to an OR-logic gate 434 and the ouput of the OR-logic gate 434 resets the Set/Reset latch 432, as well as is provided as an input to the OR-logic gate 440. As a consequence, the formatted signal DHIW (set to logic low) results at the output of the Set/Reset latch 432.

The drive logic 322 also generates internal timing markers sdinhaw, sdinhbw, sdinhcw and sdinhdw based upon the timing markers and event type information the drive logic 322 receives from the ELIF/LDE pairs A, B, C and D. These internal timing markers are relayed to an OR-logic gate 436 and the output of the OR-logic gate 436 sets the set input of a Set/Reset latch 438. The "set" signal, in this instance, implies that the formatted signal DINHW is set to logic high. As a consequence, the formatted signal DINHW (set to logic high) results at the output of the Set/Reset latch 438. Conversely, when the formatted signal DINHW needs to be set to logic low, internal timing markers rdhiaw, rdhibw, rdhicw and rdhidw and the outputs from OR-logic gates 430 and 434 are relayed to the OR-logic gate 440. The ouput of the OR-logic gate 440 resets the Set/Reset latch 438. As a consequence, the formatted signal DINHW (set to logic low) results at the output of the Set/Reset latch 438.

The output multiplexer (out mux) 450 directs the formatted signals DHIW and DINHW to the SIGS and SIGT outputs, respectively, as specified by the selected mode D1L. The SIGS and SIGT outputs have a maximum data rate of 800 MTPS in mode D1L.

For the ten other operation modes, the drive logic 322 contains other circuitry that, at the logic gate level, would include different Set/Reset Latches, OR-logic gates, and inputs to the OR-logic gates that are used to output the mode's formatted signals and/or timing markers. Consequently, each mode would have a similar logic gate layout as shown in FIG. 4. One of ordinary skill will be able to construct the logic-gate layouts of the other ten modes of operation with the information contained in Tables 1 and 2 and the internal timing markers of drive logic 322 based on the logic requirements defined by the assignments in the tables, the type bits and the internal timing markers.

Figure 5:
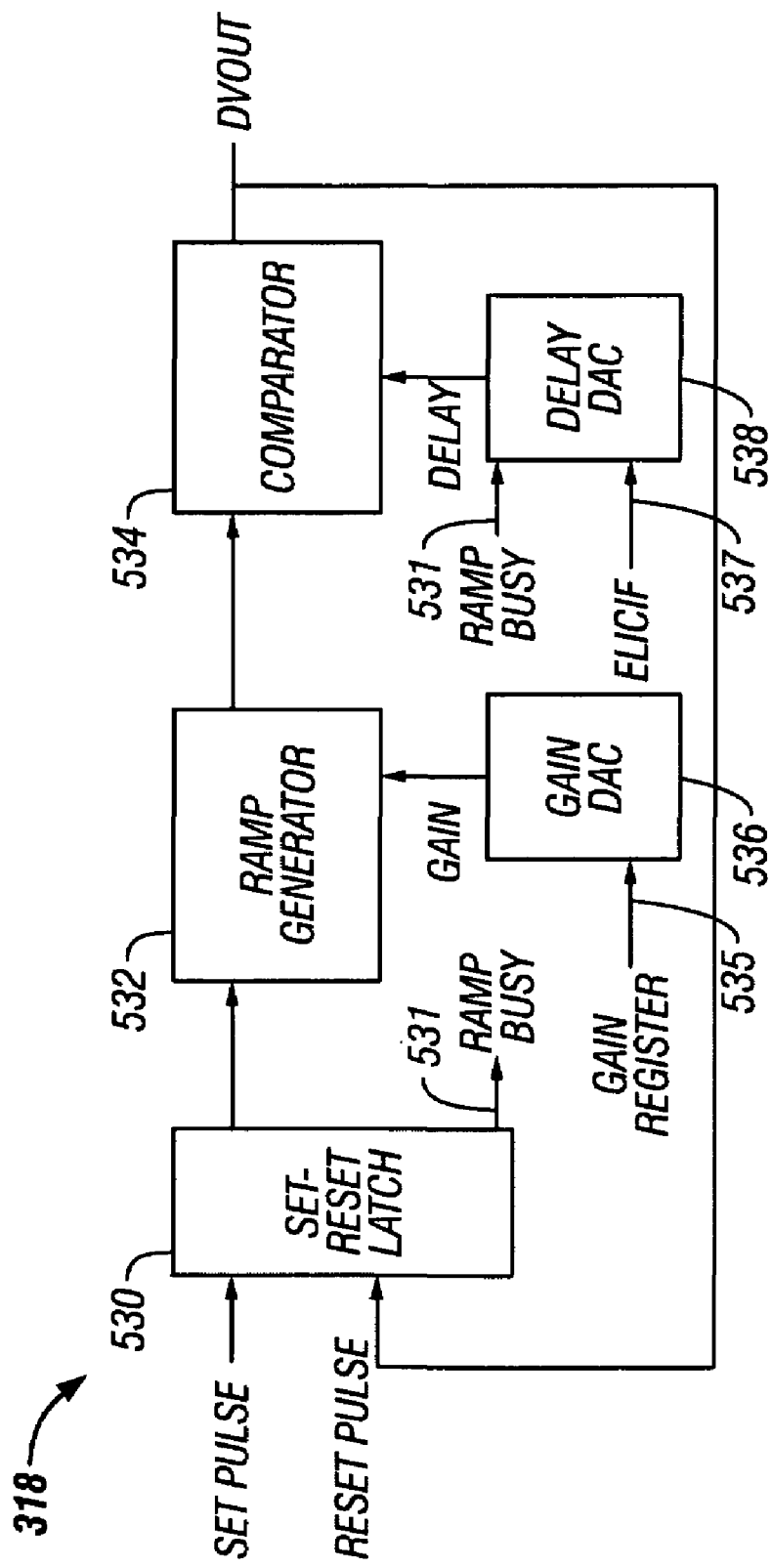
FIG. 5 is a diagram illustrating the operation of a linear delay element.

FIG. 5 illustrates the operation of the LDE 318, which may include a Set-Reset Latch 530, a Ramp Generator 532, a Comparator 534, a Gain Digital to Analog Converter (Gain DAC) 536, and a Delay Digital to Analog Converter (Delay DAC) 538. The ELIF's timing delay information 537, which is transmitted from the corresponding ELIF 316, is received by the Delay DAC 538. The gain information 535, which is transmitted from the external FPGA 332 through the register section 314, is received by the Gain DAC 536. The ramp busy signal 531 is routed to the Delay DAC 538. The rising edge of the ramp busy signal 531 indicates the completion of a ramp corresponding to an event, thereby triggering a desired event at one of the outputs of the drive logic output. The ramp busy signal's 531 rising edge is also an indication that the the LDE 318 is ready to load in the new timing delay information associated with the next event. Each LDE 318 can move edges in approximately 10 ps (picosecond) steps between the edges of a 385 MHz–420 MHz system clock.

Figure 6:
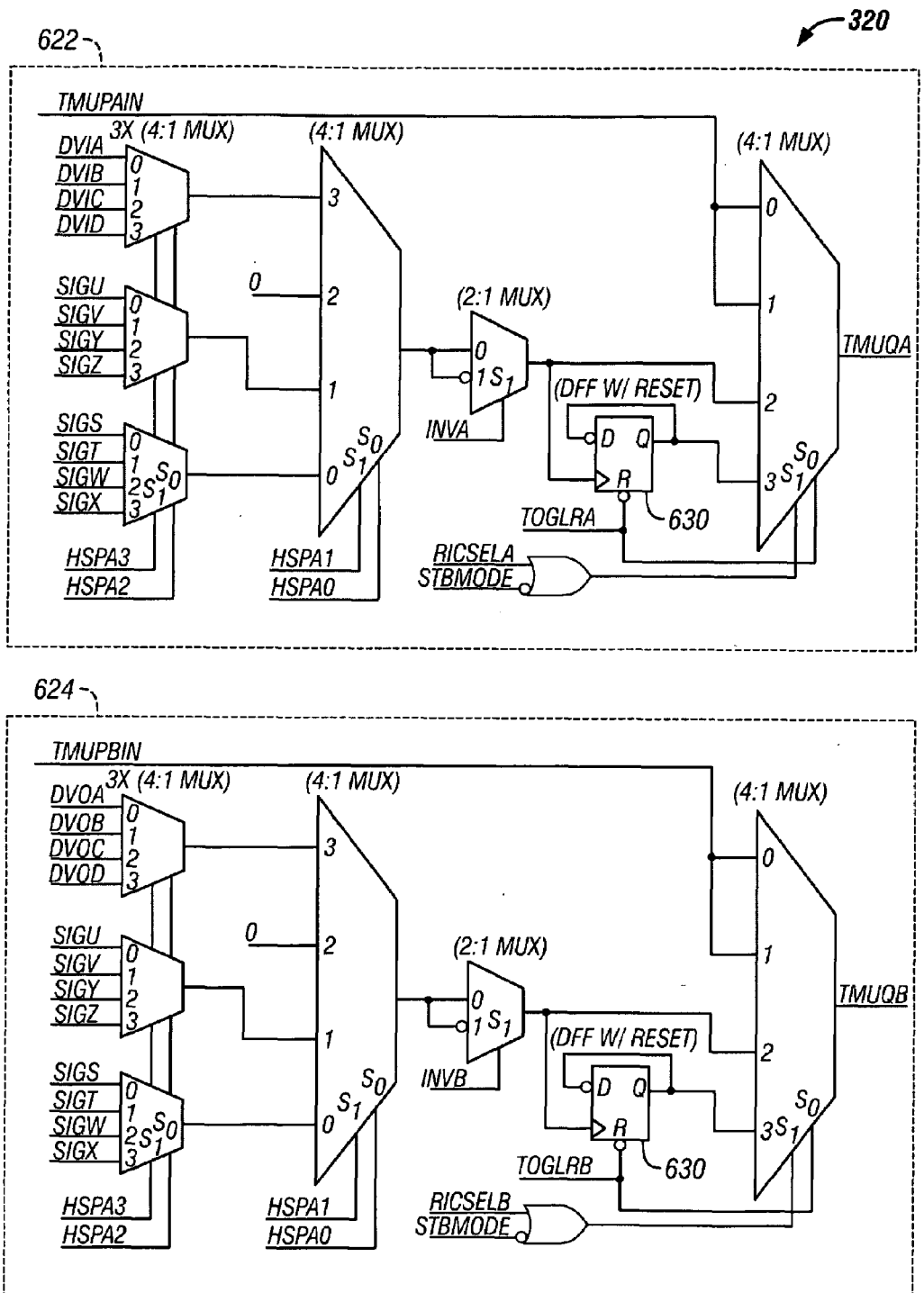
FIG. 6 is a diagram of a drive circuit's TMUMUX section.

FIG. 6 shows the drive circuit's TMUMUX section 320, which contains two high-speed TMUMUXs 622 and 624. The TMUMUX section 320 is used to select which of the many internal timing signals generated by each LDE 318 and drive logic 322 are routed, through outputs TMUQA and TMUQB, to a system timing measuring unit (TMU) for both calibration and diagnostic purposes. Some of the internal timing signals are pulses which are too short to propagate through all circuitry to get to the TMU, so the these internal timing signals are used to toggle flipflops 630. The timing of the transition of the flipfop can be easily measured as follows. Two input signals TMUPAIN and TMUPBIN are routed to TMUMUXA 622 and TMUMUXB 624, respectively, where their marker location can be measured with a high degree of accuracy and resolution. Signals DVIA, DVIB, DVIC and DVID are the triggering inputs to their respective LDE 318, while signals DVOA, DVOB, DVOC, and DVOD are the timing marker outputs from their respective LDE 318. In Modes D1P, R1P, D2P and R2P, for example, the output signals SIG* (either four or eight in number depending on the selected mode), where * is S through Z, are timing marker pulses. The toggle flipflops 630 select either very short pulses or generate signals whose edges are timed by very short pulses. The SIG* pulses are routed through the multiplexers in such a way that the toggling of the flipflops 630 can take place on either their leading or trailing edges.

Figure 7A:
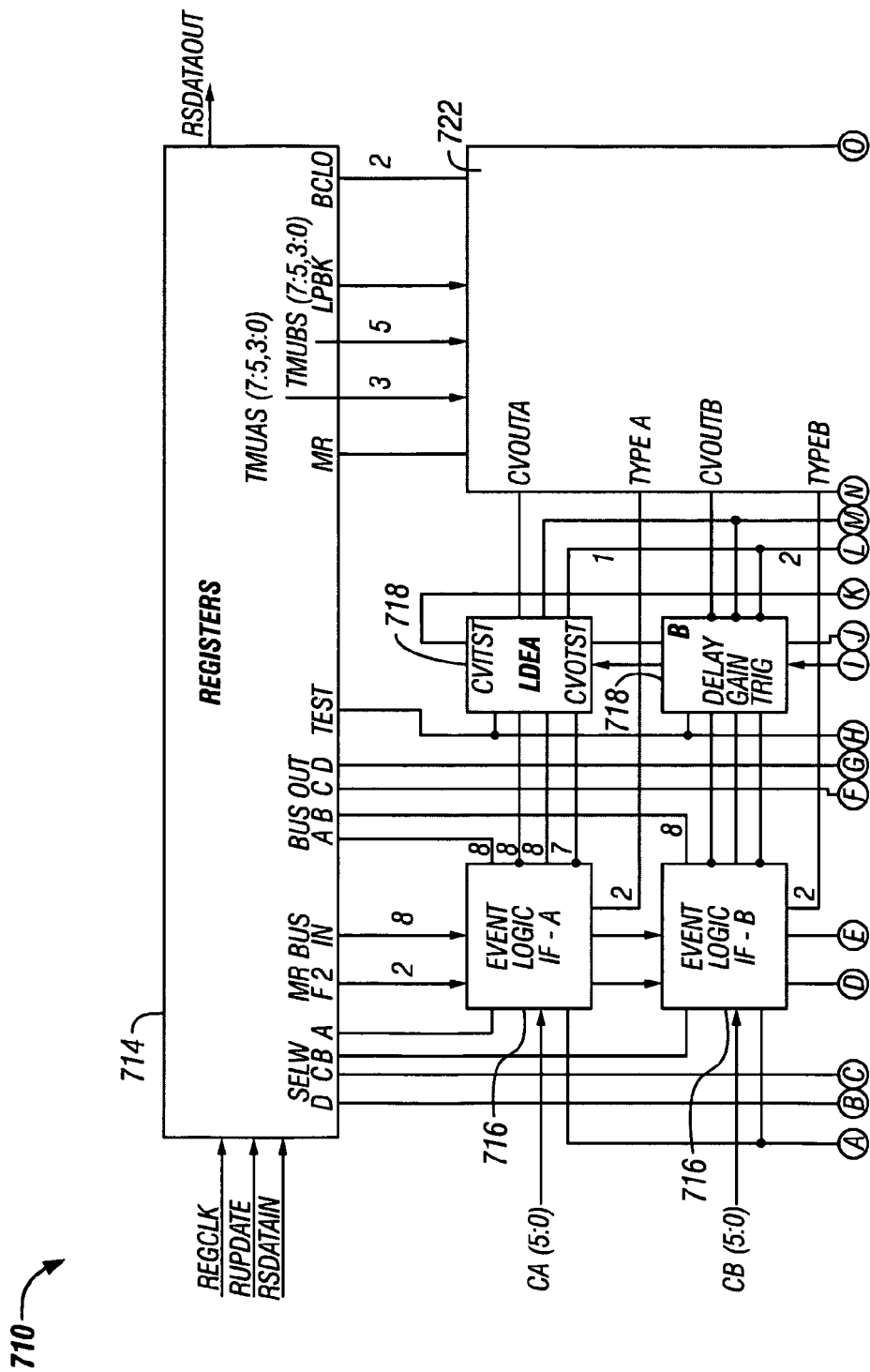
FIG. 7 is a diagram of a selectively programmable response circuit.
Figure 7B:
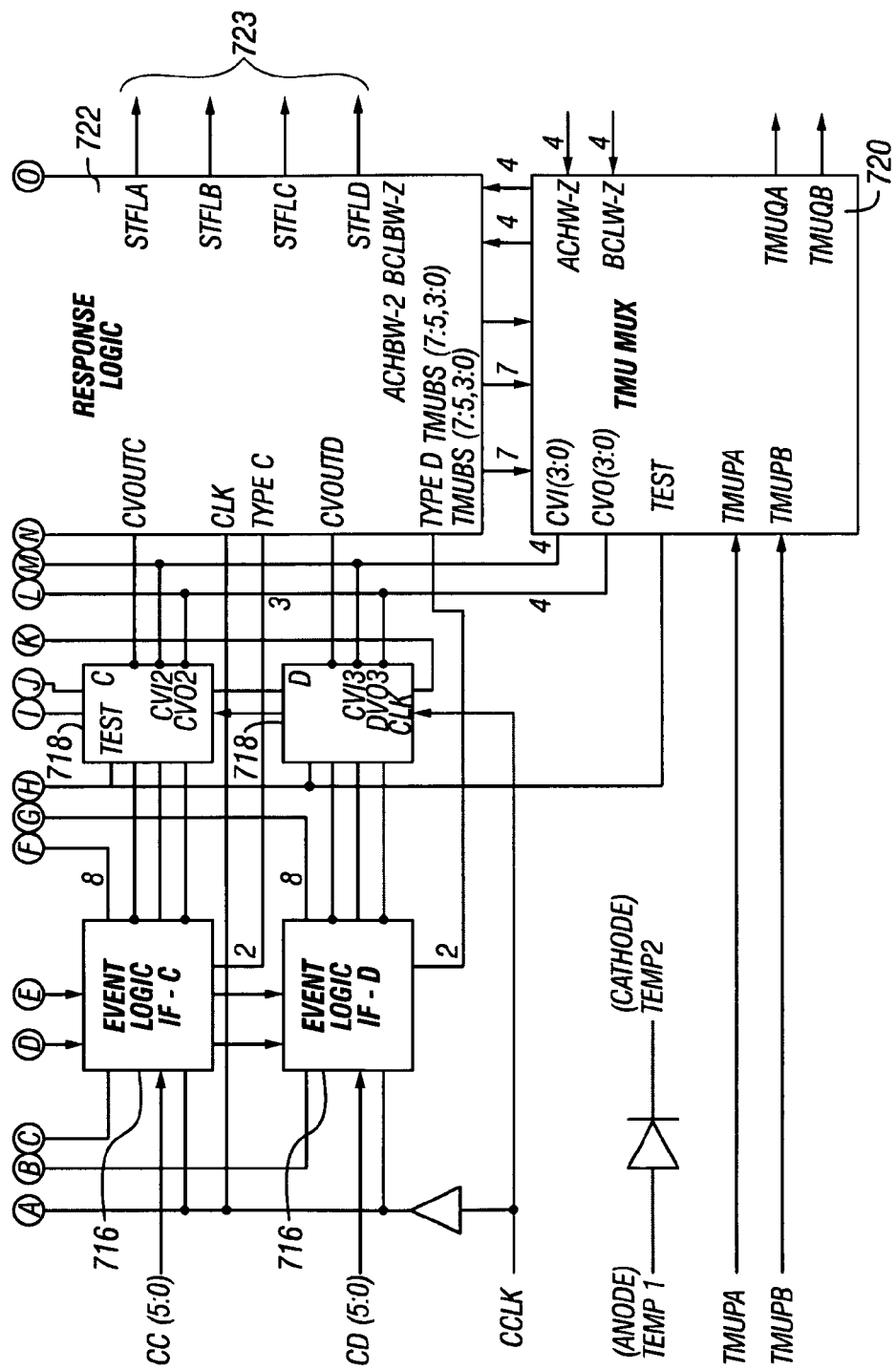

FIG. 7 shows a response formatter integrated circuit ("response circuit") 710 that is selectively programmable to operate in three modes. Generally, the response circuit 710 generates strobe timing markers, such as StbHi, StbLo, StbOff, and StbZ, which are used with event type information to strobe the signals ACH and BCL provided by the comparator block of a pin-electronics circuit to determine whether a DUT pin passes or fails the test pattern provided by drive circuit 310. If the state of signals ACH and BCL are different from that which is indicated by the event type, a "fail" signal is generated and transmitted to the output signals 723, which are referred to as STFL*, where * is A, B, C and D.

Response circuit 710 includes a register section 714, four event logic interface circuits (ELIF) 716, four corresponding linear delay elements (LDE) 718, a time measurement unit multiplexer section (TMUMUX) 720 and a drive logic 722 block.

As can be seen, response circuit 710 shares much of the same architecture as drive circuit 310. For example, the response circuit 710 and drive circuit 310 share registers which control the TMUMUX sections 320, 820. All other registers, however, are unique to the response circuit 710 and the drive circuit 310. But there are many registers that function the same in both the response circuit 710 and the drive circuit 310, such as GAIN DAIN registers, DELAY DAC registers, and MODE SELECT registers. Nevertheless, the register accessing strategy is the same, and therefore, the register accessing discussion above pertaining to drive circuit 310 is equally applicable.

Each ELIF 716 is essentially the same as drive circuit's ELIF 316, and, therefore, the discussion above pertaining to ELIF 316 is equally applicable. One difference between ELIF 716 and ELIF 316, however, is in the meaning of the event type bits, which specify whether the timing marker to be generated is StbOff, StbZ, StbHi or StbLo. Table 3 shows the decoding event types for the response circuit 710.

TABLE 3

| Response Circuit Event Types | |
|---|---|
| Type | Description |
| 0 0 | StbOff |
| 0 1 | StbZ |
| 1 0 | StbLo |
| 1 1 | StbHi |

Each LDE 718 is essentially the same as the drive circuit's LDE 318, and the operation is similar, as well, except that, in response to the timing delay values received from the ELIF 716, the LDE 718 generates strobe timing markers instead of drive timing markers. The response logic 722 receives signals Above Comparator High (ACH) and Below Comparator Low (BCL) from up to four pin-electronics comparators. At essentially the same time, response logic 722 uses event type information and the strobe markers generated by each of the LDEs 718 in response to the run-time data, to sample ACH and BCL signals. If the state of the ACH and BCL signals is different from that which is indicated by the event type, a "fail" signal is generated. For example, StbZ passes if ACH is a 0 and BCL is a 0 during strobe time, otherwise fail;

StbLo passes if BCL is a 1 during strobe time, otherwise fail;

StbHi passes if ACH is a 1 during strobe time, otherwise fail; and

If both BCL and ACH are 1, either StbLo or StbHi will pass—this is normally an invalid condition.

The four fail output signals 723 are referred to as STFL* (where *=A,B,C, or D). The fail output signals 723 reflect the associated fail exactly 6 clocks after an internal reference (called the TAG bit) associated with the edge strobe that triggered the LDE 718 on the associated ELIF/LDE pair, and this level holds until 6 clocks after the next TAG bit is received on that ELIF/LDE pair.

As mentioned above, the response logic 722 has three modes of operation, which are depicted in Table 4.

TABLE 4

Response Logic Operation Modes
STROBE

| Fail Output | Mode R1L | Mode R2L | Mode R4L |
|---|---|---|---|
| STFLA | ACHW/BCLW | ACHW/BCLW | ACHW/BCLW |
| STFLB | ACHW/BCLW | ACHW/BCLW | ACHX/BCLX |
| STFLC | ACHW/BCLW | ACHY/BCLY | ACHY/BCLY |
| STFLD | ACHW/BCLW | ACHY/BCLY | ACHZ/BCLZ |

The modes are as follows:

Mode R1L—the response logic 722 receives signals ACHW and BCLW from a single pin-electronics comparator. All four ELIF/LDE pairs (A, B, C and D) are merged to generate fail outputs, STFLA, STFLB, STFLC and STFLD. This mode has the highest strobe rate of 800 MTPS.

Mode R2L—the response logic 722 receives signals ACHW, BCLW, ACHY and BCLY from two pin-electronics comparators. ELIF/LDE pairs A and B are merged to generate fail outputs STFLA and STFLB for the signals ACHW and BCLW, which are received from a pin-electronics comparator. ELIF/LDE pairs C and D are merged to generate fail outputs STFLC and STFLD for the signals ACHY and BCLY, which are received from a separate pin-electronics comparator.

Mode R4L—Each ELIF/LDE pair issues fail outputs corresponding to ACH and BCL inputs received from four separate pin-electronics comparators.

Figure 8A:
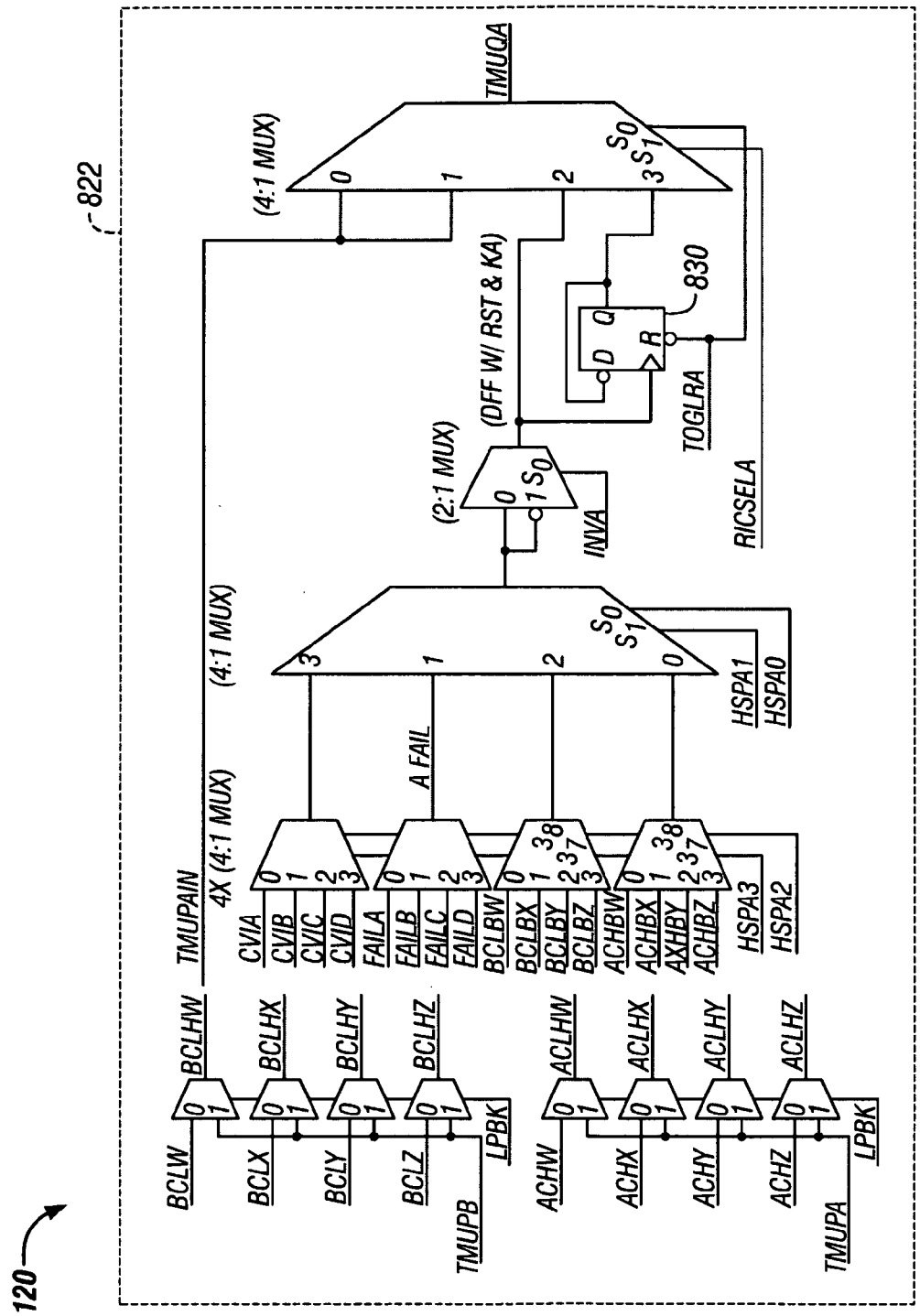
FIG. 8 is a diagram of a response circuit's TMUMUX section.
Figure 8B:
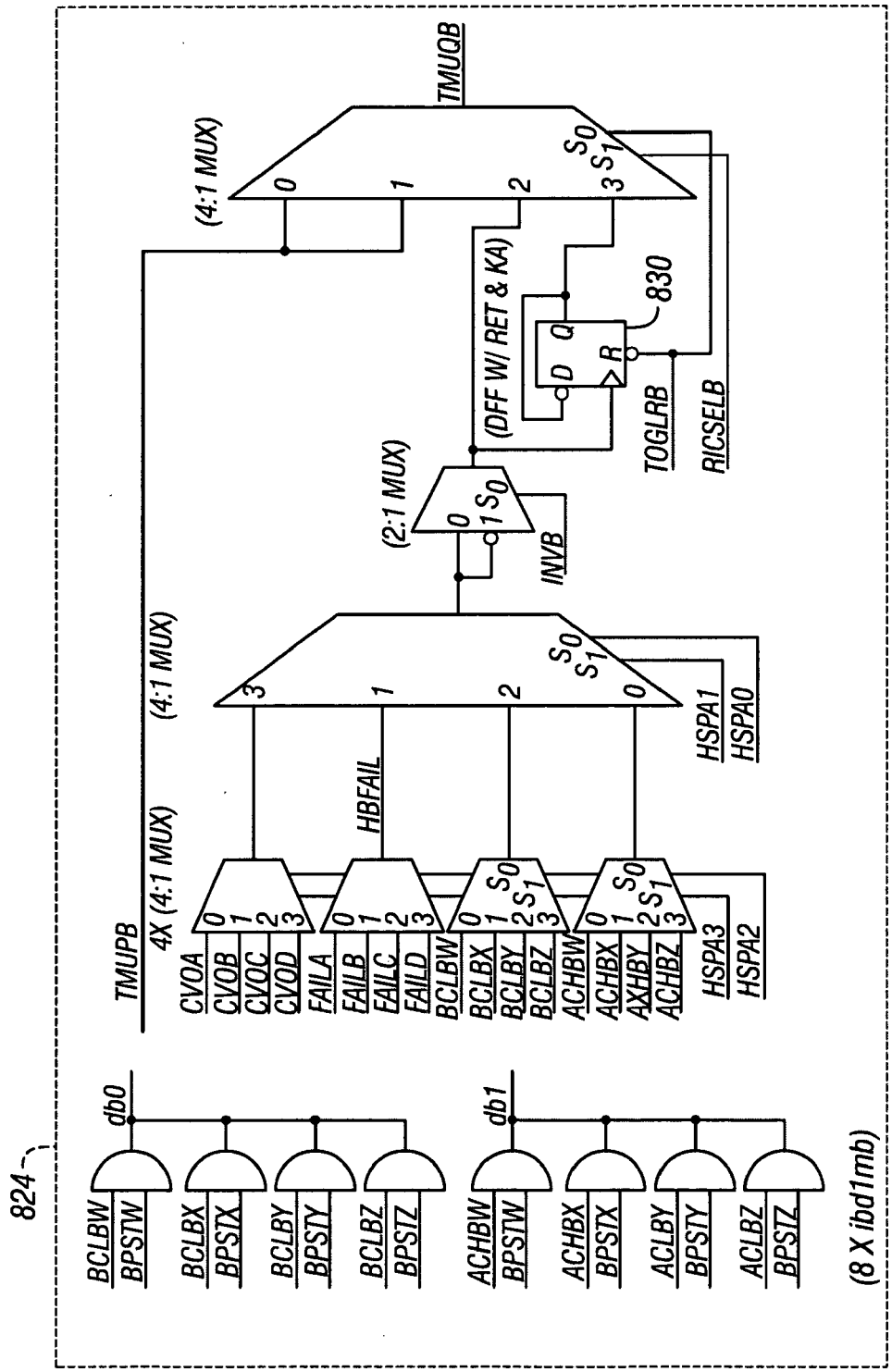

The TMUMUX section 720 relays signals from inside the response circuit 710 (or those received from the drive circuit 310) on the output port for system calibration and diagnostic purposes. FIG. 8 shows the response circuit's TMUMUX section 720, which includes two high-speed TMU MUXs 822 and 824. The TMU MUX section 820 performs high-speed system calibration and diagnosis. Two input signals TMUPA and TMUPB (which are the previously selected timing signals from the drive circuit 310) are routed to TMUMUXA 822 and TMUMUX 824, respectively, where their marker location can be measured with a high decree of accuracy and resolution. The signals ACH* and BCL* (where *=W,X,Y and Z) are the discriminated level signals from the DUT pins. The signals RPST* (where *=W,X,Y and Z) are associated with the register in the register section 314, that selects the desired BCL* and ACH* levels for read back onto bits 0 and 1 of the output data bus. The other signals are control register steering bits. As in the case of the drive circuit TMUMUXs, the toggle flipflops 830 select either the very short pulses or generate signals whose edges are timed by the very short pulses. Toggling can take place on either leading or trailing edge.

Figure 9:
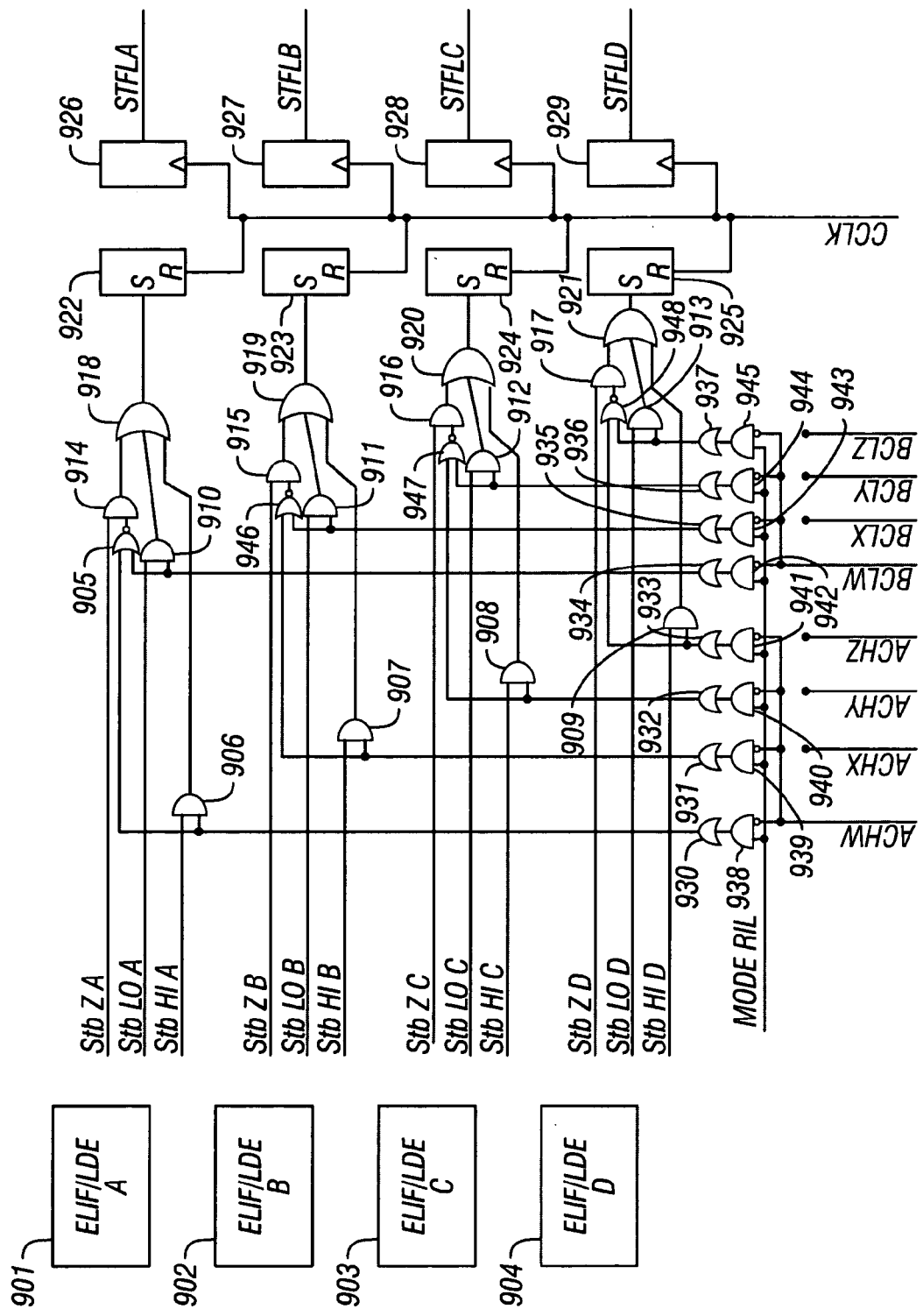
FIG. 9 is a diagram showing a logical representation of the response logic programmed to operate in a particular mode.

FIG. 9 illustrates an example of the operation of response logic 722 in the generation of fail signals STFLA, STFLB, STFLC, and STFLD in a particular one of the modes—namely R1L. It should be noted that FIG. 9 is a functional depiction, using logic gate representations, of response logic 722 operating in mode R1L. In practice, the response logic circuit 722 is implemented by a combination of logic gates and multiplexers, as well as set and reset registers and latches, the interconnections of which are selectable based upon the response test mode selected by the user of the test system. Assuming that a user selects mode R1L, and assuming that the user has selected the edge strobe mode, then the operation is as follows. ELIF/LDE blocks A 901, B 902, C 903, and D 904 each produce three signals StbZ, StbLo, and StbHi as described earlier. In this implementation, window strobes are not used so there is no X event generated. Different implementations could use window strobes, however, if desired or needed. An AND-logic gate 938 is enabled by Mode R1L and passes the negative-sensed signal ACHW (as indicated by the bubble on the input driven by ACHW) from the device being tested through OR-logic gate 930 to an input of AND-logic gate 906. When this input of AND-logic gate 906 is true, the marker StbHiA from ELIF/LDEA 901 is transmitted to OR-logic gate 918 which then sets flip-flop 922, a positive-edge-triggered SET/RESET flip-flop that is well known in the art. On the next positive edge of the signal CCLK, the state of flip-flop 922 is clocked into D-type edge-triggered flip-flop 926 and resets flip-flop 922. The output of flip-flop 926 is the fail signal STFLA. Similar connections to AND-logic gates 939–941, OR-logic gates 931–933, AND-logic gates 907–909, OR-logic gates 919–921, positive-edge-triggered flip-flops 923–925, and D-type edge-triggered flip-flops 927–929 produce the fail signals STFLB, STFLC, and STFLD.

The four fail signals just described result from the specific device output failure recorded when ACHW is sensed to be LOW—the device output signal is not "Above Comparator High" (i.e., above a Comparator High voltage level setting defined externally) at the marker StbHiA, and therefore the device output is failing. Mode R1L also connects to AND-logic gate 942 enabling the negative-sensed signal BCLW to be passed through OR-logic gate 934 to AND-logic gate 910 which enables the marker StbLoA generated by ELIF/LDEA 901 to the OR-logic gate 918. The output of OR-logic gate 930 is also connected to NOR-logic gate 905. The output of AND-logic gate 910 is also connected to NOR-logic gate 905. If both of these two inputs of NOR-logic gate 905 are LOW, then its output will be HIGH enabling the marker StbZA from ELIF/LDEA 901 to pass to OR-logic gate 918. The marker StbLoA therefore sets STFLA if the signal BCLW is LOW—the device output BCLW is not "Below Comparator Low". The marker StbZA therefore sets STFLA whenever either of the signals ACHW or BCLW are HIGH—in either of these cases the device output is not in the tristate (or "Z") condition which is defined to be between the Comparator High voltage level and the Comparator Low voltage level. Whenever the marker StbLoA or the marker StbZA is transmitted to the OR-logic gate 918, the flip-flop 922 will be set, thereby allowing a fail to be transmitted to STFLA as described above. Similar connections to AND-logic gates 915–917, NOR-logic gates 946–948, and OR-logic gates 919–921, enable the flip-flops 923–925 to be set by markers StbLoB,C,D or markers StbZB,C,D thereby setting fail signals STFLB,C, and D. Logical connections required to enable fail signals STFLB, C, and D to be set based on the device output signals ACHX, ACHY, ACHZ, BCLX, BCLY, and BCLZ require different arrangements of gates connecting signals to OR-logic gates 930–937.

Mode R2L requires gates enabling ACHY to OR-logic gates 932 and 933 rather than ACHW, and gates enabling BCLY to OR-logic gates 936 and 937 rather than BCLW. With these connections, fails will be recorded on STFLA and STFLB whenever ACHW is sensed LOW by markers StbHiA or StbHiB, while fails will be recorded whenever ACHY is sensed LOW by markers StbHiC or StbHiD, and similarly for related conditions on BCLW and BCLY.

Mode R4L requires gates enabling ACHX to OR-logic gate 931, ACHY to OR-logic gate 932, ACHZ to OR-logic gate 933, BCLX to OR-logic gate 935, BCLY to OR-logic gate 936, and BCLZ to OR-logic gate 937. With these connections, a failure condition will be recorded on STFLA whenever ACHW and/or BCLW is sensed to have failed, a failure condition on ACHLX and/or BCLX will be recorded on STFLB, a failure condition on ACHLY and/or BCLY will be recorded on STFLC, and a failure condition on ACHLZ and/or BCLZ will be recorded on STFLD. Other than as described above, all other logic remains unchanged from one mode to another.

Figure 10:
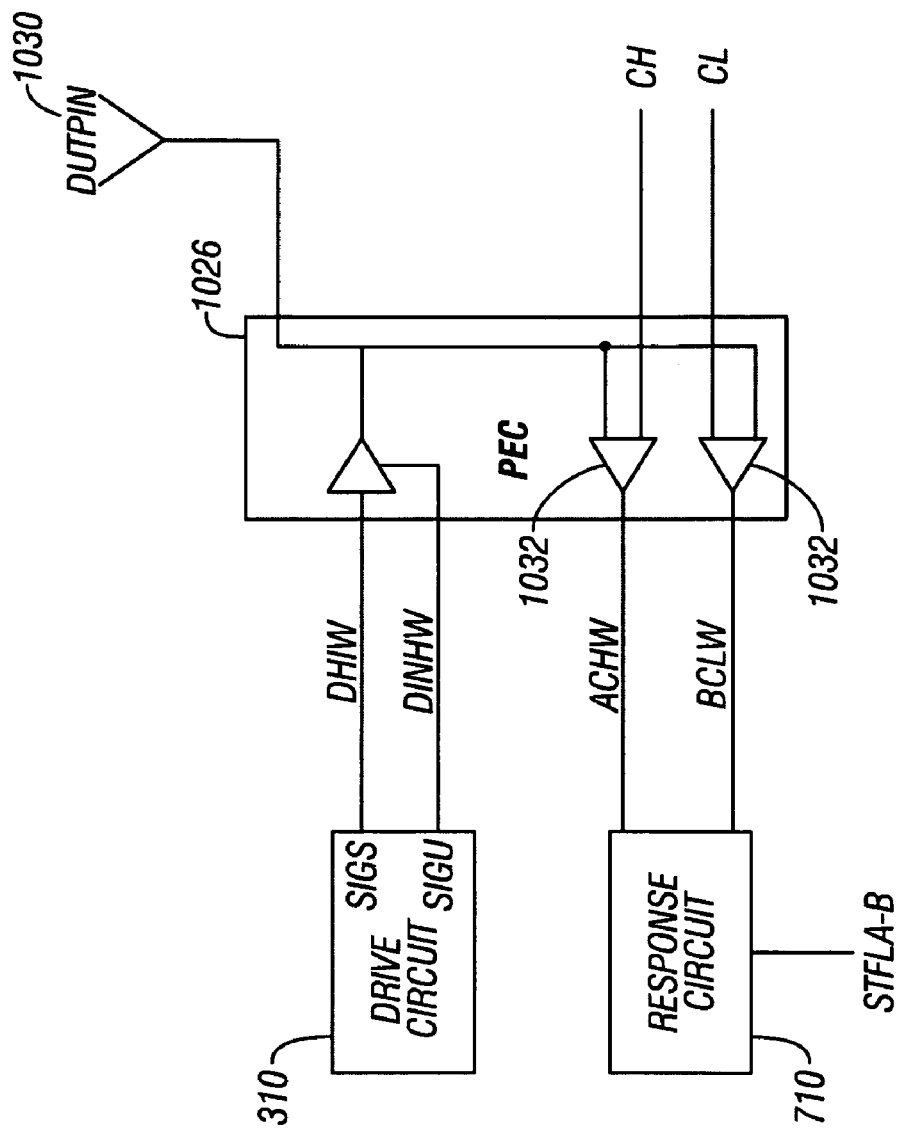
FIG. 10 is a diagram showing a drive circuit and a response circuit, each operating in a particular mode.

FIG. 10 shows the drive circuit 310, operating in mode D1L, and response circuit 710, operating in mode R1L, in context with the pin-electronics circuit (PEC) 1026 and a DUT pin 1030. The PEC 1026 generally operates as follows. When the state of signal DINHW is LOW, for example, the DUT pin 1030 is in the input state. In that case, if the state of signal DHIW is HIGH, the PEC 1026 drives the DUT pin 1030 high; but if the state of signal DHIW is LOW, the PEC 1026 drives the DUT pin 1030 low. When the state of signal DINHW is HIGH, for example, the DUT Pin 1030 is in the output state. In that case, the output signal from the DUT pin 1030 is compared to signals Comparator High (CH) and Comparator Low (CL) at the pin-electronics comparator 1032 located within the PEC 1026. If the output signal from the DUT pin 1030 is above the signal CH, then the state of the signal Above Comparator High (ACH) is HIGH; but if the output signal from the DUT pin 1030 is below the signal CL, then the state of the signal Below Comparator Low (BCL) is HIGH. If output signal from the DUT pin 1030 is between the signals CH and CL, then the state of both signals ACH and BCL are LOW.

As stated above, the response circuit 710 generates timing markers (StbHi, StbLo, StbOff, and StbZ) which are used with event type information to strobe the signals ACHW and BCLW provided by the pin-electronics comparator 1032 to determine whether the DUT pin 1030 passes or fails the test. If the state of signals ACHW and BCLW are different from that which is indicated by the event type, a "fail" signal is generated and outputted at STFLA.

Other embodiments may include different or additional features. For example, other modes can be realized. For example, process steps can be performed in a different order and still achieve desirable results. Moreover, the formatted signal DINH can be controlled by pulses and the formatted signal DHI can be controlled by a level. The mode could be called D1LP or D2LP). In addition, support for more than four DUT pins can be achieved by adding more "ELIF/LDE pairs" to the circuitry of the drive and response circuits. Furthermore, if higher data rates are desired, multiple drive circuits can be multiplexed to achieve faster data rates. Likewise, multiple response circuits can be multiplexed to achieve similar high-speed data rates. Also, faster logic could be used in the drive and response circuits to achieve higher data rates. Moreover, the response circuit and the drive circuit could be combined into one device, and, therefore, the modes of operation would include both strobing and driving, either together or separately.

The computational aspects described here can be implemented in digital electronic circuitry, or in computer hardware, firmware, software, or in combinations of them. Where appropriate, aspects of these systems and techniques can be implemented in a computer program product tangibly embodied in a machine-readable storage device for execution by a programmable processor; and method steps can be performed by a programmable processor executing a program of instructions to perform functions by operating on input data and generating output.

To provide for interaction with a user, a computer system can be used having a display device such as a monitor or LCD screen for displaying information to the user and a keyboard and a pointing device such as a mouse or a trackball by which the user can provide input to the computer system. The computer system can be programmed to provide a graphical user interface through which computer programs interact with users.

Other embodiments are within the scope of the following claims.

What is claimed is:

1. A drive circuit for an automatic test equipment formatter, the drive circuit comprising:
    in event logic section comprising a plurality of event logic interfaces, each event logic interface configured for decoding signals received from an external event timing generation circuit;
    a linear delay element section comprising a plurality of linear delay elements, each linear delay element being coupled to a corresponding event logic interface and being capable of generating timing markers corresponding to signals received from an event logic interface; and
    a programmable drive logic configured to operate in a plurality of modes, wherein the plurality of modes includes at least a first mode and a second mode, further wherein in the first mode, the programmable drive logic is configured to drives a combination of drive signals or timing markers or both at a data rate different from a data rate of the second mode.

2. The drive circuit of claim 1 wherein each event logic interface is paired wit a corresponding linear delay element to form a channel to provide signals defining a drive signal or timing marker or both to the programmable drive logic.

3. The drive circuit of claim 1 further comprising a register section being configured to receive control setup information from an external source.

4. The drive circuit of claim 3 further comprising a timing measurement unit section, said timing measurement unit section further comprising at least two timing measurement unit multiplexers.

5. The drive circuit of claim 1 wherein the programmable drive logic comprises a plurality of programmable multiplexers.

6. The drive circuit of claim 5 wherein the plurality of multiplexers are programmed to logically combine signals received from a plurality of linear delay elements to form a desired combination of drive signals or timing markers or both.

7. The drive circuit of claim 5 further comprising a plurality of logic elements configured to logically combine signals received from one or more multiplexers.

8. The drive circuit of claim 1 wherein each event logic interface is paired with a corresponding linear delay element to form a channel to provide signals to the drive logic, and wherein a first mode uses a different number of channels than a second mode.

9. The drive circuit of claim 8 wherein the different number of channels corresponds to a number of device pins to be driven.

10. The drive circuit of claim 1 wherein the programmable drive logic further is configured to operate in any of a plurality of strobe modes, each strobe mode corresponding to a different combination of strobe signals.

11. The drive circuit of claim 10 wherein each event logic interface is paired with a corresponding linear delay element to form a channel to provide signals to the drive logic, and wherein each strobe mode uses a different number of channels to form corresponding strobe signals.

12. A response circuit far an automatic test equipment formatter, the response circuit comprising:
  an event logic section comprising a plurality of event logic interfaces, each event logic interface configured for decoding signals received from an external event timing generation circuit;
  a linear delay element section comprising a plurality of linear delay elements, each linear delay element being coupled to a corresponding event logic interface and being capable of generating timing markers corresponding to signals received from an event logic interface; and
  a programmable response logic configured to operate in any of a plurality of modes, wherein the plurality of modes includes at least a first mode and a second mode, further wherein in the first mode, the programmable response logic is configured to strobes a combination of strobe signals at a data rate different from a data rate of the second mode.

13. The response circuit of claim 12 wherein the response circuit further is programmable to receive response signals from one or more pin-electronics comparators.

14. The response circuit of claim 12 wherein each event logic interface is paired with a corresponding liner delay element to form a channel to provide signals received from one or more pin-electronic, comparators to the programmable response logic.

15. The response circuit of claim 12 further comprising a register section being configured to receive control setup information from an external source.

16. The response circuit of claim 15 further comprising a timing measurement unit section, said timing measurement unit section further comprising at least two timing measurement unit multiplexers.

17. The response circuit of claim 12 wherein the programmable response logic comprises a plurality of programmable multiplexers.

18. The response circuit of claim 17 wherein the plurality of programmable multiplexers are selectively programmable to cause the response logic to operate in any of the plurality of different modes, each mode corresponding to a different number of pin-electronics comparators from which response signals are to be received.

19. The response circuit of claim 18 wherein each event logic interface is paired with a corresponding linear delay element to form a channel to receive response signals from the response logic, and wherein a first mode uses a different number of channels than a second mode.

20. The response circuit of claim 19 wherein the response circuit is configured in the first mode to receive response signals from a single pin-electronics comparator and to use four merged channels to generate fail outputs.

21. The response circuit of claim 19 wherein the response circuit is configured in the second mode to receive response signals from two separate pin-electronics comparators and to use two merged channels for each pin-electronics comparator to generate fail outputs.

22. The response circuit of claim 18 wherein each event logic interface is paired with a corresponding linear delay element to form a channel to receive response signals from the response logic, and wherein the response circuit is configured in a third mode to receive response signals from four pin-electronics comparators and to use a separate channel for each pin comparator to generate fail outputs.

23. A test system formatter comprising:
  a programmable drive circuit configured to operate in any of a plurality of drive modes, wherein the plurality of drive modes includes at least a first drive mode and a second drive mode, further wherein in the first drive mode, the programmable drive circuit is configured to drive a combination of drive signals or drive timing markers or both at a data rate different from a data rate of the second drive mode; and
  a programmable response circuit configured to operate in any of a plurality of strobe modes, wherein the plurality of strobe modes includes at least a first strobe mode and a second strobe mode, further wherein in the first strobe mode, the programmable response circuit is configured to strobe a combination of strobe signals at a data rate different from a data rate of the second strobe mode.

24. The test system formatter of claim 23 further comprising a plurality of drive channels, each drive channel for providing signals to the drive circuit to be used to generate drive signals or drive timing markers or both.

25. The test system formatter of claim 24 wherein each drive channel comprises an event logic interface and a corresponding linear delay element.

26. The test system formatter of claim 24 wherein the programmable drive circuit is configured to route signals through a plurality of channels in parallel to be used for generating drive signals or timing markers or both.

27. The test system formatter of claim 23 further comprising a plurality of response channels, each response channel for receiving response signals from one or more pin-electronics comparators.

28. The test system formatter of claim 27 wherein each response channel comprises an event logic interface and a corresponding linear delay element.

29. The test system formatter of claim 27 wherein the programmable response circuit is configured to route response signals through a plurality of response channels in parallel to be used to generate fail signals.

30. A method of configuring an integrated circuit test system, the method comprising:
  providing a test system having a formatter with a programmable drive circuit;
  configuring the test system to be in communication with a device under test; and
  programming the drive circuit to operate in a selected mode from among a plurality of drive modes, wherein the plurality of drive modes includes at least a first drive mode and a second drive mode, further wherein in the first drive mode the drive circuit drives a combination of formatted drive signals or drive signal timing markers or both at a data rate different from a data rate of the second drive mode; and
  applying the combination corresponding to the selected mode to a plurality of pin electronics circuits.

31. The method of claim 30 further comprising programming the drive circuit to receive input signals from a plurality of channels in parallel.

32. The method of claim 31 wherein input signals from a plurality of channels are merged to generate one or more drive signals.

33. The method of claim 32 wherein merging input signals from a plurality of channels increases the drive signal data rate.

34. The method of claim 32 further comprising:
providing a programmable response circuit; and
programming the response circuit to operate in a selected mode from among a plurality of strobe modes, each strobe mode corresponding to a different number of pin-electronics comparators of the plurality of pin electronics circuits from which response signals are to be received and having a strobe rate different from another strobe mode.

35. A test system formatter comprising:
a programmable circuit configured to operate in a plurality of modes, wherein the plurality of modes include, at least a first mode and a second mode, further wherein in the first mode, the programmable circuit is configured to drive or strobe signals at a rate different from a rate of the second mode to or from a plurality of pin electronics circuits.

36. The test system formatter of claim 35, wherein the programmable circuit is a programmable drive circuit and the signals include drive signals or drive timing markers or both.

37. The test system formatter of claim 36 further comprising a plurality of drive channels, each drive channel for providing signals to the programmable drive circuit to be used to generate drive signals or drive timing markers or both.

38. The test system formatter of claim 37 wherein each drive channel comprises an event logic interface and a corresponding linear delay element.

39. The formatter of claim 37 wherein the programmable drive circuit is configured to route signals through the plurality of drive channels in parallel.

40. The test system formatter of claim 36, wherein the programmable circuit is a programmable response circuit and the signals include strobe signals.

41. The test system formatter of claim 40 further comprising a plurality of response channels, each response channel for receiving response signals from a pin electronics comparator located in each of a plurality of pin electronics circuits.

42. The test system formatter of claim 41 wherein each response channel comprises an event logic interface and a corresponding linear delay element.

43. The test system formatter of claim 41 wherein the programmable response circuit is configured to route response signals through the plurality of response channels in parallel to be used to generate fail signals.

* * * * *